United States Patent
Ji et al.

(10) Patent No.: US 11,693,786 B2
(45) Date of Patent: Jul. 4, 2023

(54) SEMICONDUCTOR MEMORY DEVICE WITH MAPPING FACTOR GENERATING UNIT FOR IMPROVING RELIABILITY

(71) Applicant: Changxin Memory Technologies, Inc., Anhui (CN)

(72) Inventors: Kangling Ji, Hefei (CN); Weibing Shang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 249 days.

(21) Appl. No.: 17/171,214

(22) Filed: Feb. 9, 2021

(65) Prior Publication Data
US 2021/0182205 A1 Jun. 17, 2021

Related U.S. Application Data

(63) Continuation of application No. PCT/CN2019/116061, filed on Nov. 6, 2019.

(30) Foreign Application Priority Data

Nov. 8, 2018 (CN) .......................... 201811325774.6
Nov. 8, 2018 (CN) .......................... 201821859417.3

(51) Int. Cl.
*G11C 8/12* (2006.01)
*G06F 12/10* (2016.01)
(Continued)

(52) U.S. Cl.
CPC .............. *G06F 12/10* (2013.01); *G06F 7/582* (2013.01); *G06F 12/1408* (2013.01); *G11C 8/12* (2013.01);
(Continued)

(58) Field of Classification Search
CPC ...... G06F 12/10; G06F 7/582; G06F 12/1408; G06F 2212/657; G11C 8/12; G11C 11/4076; G11C 11/4096
See application file for complete search history.

(56) References Cited

U.S. PATENT DOCUMENTS 7,398,362 B1 * 7/2008 Tischler .............. G06F 12/0607
711/E12.079
7,826,277 B2 11/2010 Shin et al.
(Continued)

FOREIGN PATENT DOCUMENTS

CN 101533671 A 9/2009
CN 101556561 A 10/2009
(Continued)

OTHER PUBLICATIONS

PCT International Search Report and the Written Opinion dated Feb. 3, 2020, issued in related International Application No. PCT/CN2019/116061 (9 pages).

*Primary Examiner* — Mushfique Siddique
(74) *Attorney, Agent, or Firm* — Sheppard Mullin Richter & Hampton LLP

(57) ABSTRACT

A semiconductor memory is provided. The memory includes: a memory array; a row address processing unit configured to output a row address; a bank address processing unit configured to output a bank address; a column address processing unit configured to output a column address; and a mapping factor generating unit, configured to generate a mapping factor, wherein an output of the mapping factor generating unit is coupled to at least one of an output of the row address processing unit, an output of the bank address processing unit, and an output of the column address processing unit, and the output of the mapping factor generating unit is further coupled to the memory array, and wherein the memory array receives a result from logical processing performed on the mapping factor and at least one of the row address, the bank address, and the column address. The technical solutions of the embodiments of the present invention can improve the security, service life and reliability of the semiconductor memory.

19 Claims, 5 Drawing Sheets

(51) Int. Cl.
   *G06F 7/58* (2006.01)
   *G06F 12/14* (2006.01)
   *G11C 11/4076* (2006.01)
   *G11C 11/4096* (2006.01)
   *G11C 11/408* (2006.01)

(52) U.S. Cl.
   CPC ........ *G11C 11/408* (2013.01); *G11C 11/4076* (2013.01); *G11C 11/4096* (2013.01); *G06F 2212/657* (2013.01)

(56) References Cited

U.S. PATENT DOCUMENTS

| | | | |
|---|---|---|---|
| 8,751,729 B2 | 6/2014 | Mun et al. | |
| 2013/0094320 A1* | 4/2013 | Yoo | G06F 12/02 |
| | | | 365/230.01 |
| 2013/0097403 A1* | 4/2013 | Zheng | G06F 12/1036 |
| | | | 711/206 |
| 2018/0315484 A1 | 11/2018 | Ye | |

FOREIGN PATENT DOCUMENTS

| | | |
|---|---|---|
| CN | 102568575 A | 7/2012 |
| CN | 105679365 A | 6/2016 |
| CN | 208922741 U | 5/2019 |

* cited by examiner

SEMICONDUCTOR MEMORY DEVICE WITH MAPPING FACTOR GENERATING UNIT FOR IMPROVING RELIABILITY

CROSS-REFERENCE TO RELATED APPLICATIONS

This application is a continuation application of International Patent Application No. PCT/CN2019/116061, filed on Nov. 6, 2019, which is based on and claims priority of the Chinese Patent Applications No. 201811325774.6 and No. 201821859417.3, both filed on Nov. 8, 2018. The above-referenced applications are incorporated herein by reference in their entirety.

TECHNICAL FIELD

The present invention relates generally to the field of integrated circuit technologies and more specifically, to a semiconductor memory.

BACKGROUND

The information disclosed in this Background section is only for providing a background or context for the embodiments of the present invention set forth in the claims, and therefore may contain information that does not form the prior art already known to a person of ordinary skill in the art.

Semiconductor memory devices include, for example, static random access memories (SRAM), dynamic random access memories (DRAM), read only memories (ROM), flash memory, etc.

In the case of DRAM, as the feature size of DRAM becomes smaller and smaller, the reliability issues of DRAM become increasingly pronounced. DRAM has a word line decoder (WL decoder) circuit that requires a large area. If DRAM keeps performing operations on the same address for a long period of time, sequential circuits need to be added to the DRAM in order to ensure that the path function of the WL decoder circuit does not degrade or to reduce the degradation rate of its path function, thus increasing the area of the device. For example, the length or width of the device may be increased, or an auxiliary cascade transistor may be added to limit the drain-source voltage (Vds) of the metal-oxide-semiconductor (MOS) transistor in a closed circuit, thereby increasing the chip size and costs of the design and manufacturing processes. Thus, improving the reliability of semiconductor memory devices (e.g. DRAM) without increasing the sizes of sequential circuits is an urgent problem to be solved.

SUMMARY

Embodiments of the present invention provide a semiconductor memory to address one or more of the technical limitations in the prior art.

In one aspect, an embodiment of the present invention provides a semiconductor memory. The semiconductor memory may comprise a memory array; a row address processing unit, configured to output a row address; a bank address processing unit, configured to output a bank address; a column address processing unit configured to output a column address; and a mapping factor generating unit, configured to generate a mapping factor. The output of the mapping factor generating unit may be coupled to at least one of an output of the row address processing unit, an output of the bank address processing unit, and an output of the column address processing unit. And the output of the mapping factor generating unit may further coupled to the memory array. The memory array may receive a result from logical processing performed on the mapping factor and at least one of the row address, the bank address, and the column address.

In some embodiments, the mapping factor generating unit may comprise a random number generator having an output serving as the output of the mapping factor generating unit, and configured to generate a pseudo random number sequence; and a controller, coupled to the random number generator, and configured to control a timing sequence according to which the random number generator generates the pseudo random number sequence. The mapping factor may comprise the pseudo random number sequence.

In some embodiments, the mapping factor generating unit may comprise a random number generator having an input coupled to the memory array and an output serving as the output of the mapping factor generating unit, and configured to read initial output data from the memory array after the semiconductor memory is powered up and output the initial output data; and a controller, coupled to the random number generator, and configured to control a timing sequence according to which the random number generator outputs the initial output data. The mapping factor may comprise the initial output data.

In some embodiments, the mapping factor generating unit may comprise a random number generator having an input coupled to the memory array and an output serving as the output of the mapping factor generating unit, and configured to read random output data from the memory array and output the random output data; and a controller, coupled to the random number generator and the memory array, and configured to control a timing sequence according to which the random number generator outputs the random output data, and configured to turn off a word line of the semiconductor memory to allow the random number generator to read the random output data from the memory array. The mapping factor may comprise the random output data.

In some embodiments, the mapping factor generating unit may comprise a first random number generator, configured to generate a pseudo random number sequence; a second random number generator having an input coupled to the memory array, and configured to read initial output data from the memory array after the semiconductor memory is powered up and output the initial output data; a third random number generator having an output serving as the output of the mapping factor generating unit, coupled to an output of the first random number generator and an output of the second random number generator, and configured to randomly mix the pseudo random number sequence and the initial output data and output mixed data; and a controller, coupled to the first random number generator, the second random number generator, and the third random number generator, and configured to control a timing sequence according to which the first random number generator generates the pseudo random number sequence, control a timing sequence according to which the second random number generator outputs the initial output data, and control a timing sequence according to which the third random number generator outputs the mixed data. The mapping factor may comprise the mixed data.

In some embodiments, the mapping factor generating unit may comprise a first random number generator, configured to generate a pseudo random number sequence; a second random number generator having an input coupled to the memory array, and configured to read random output data from the memory array and output the random output data; a third random number generator having an output serving as the output of the mapping factor generating unit, coupled to an output of the first random number generator and an output of the second random number generator, and configured to randomly mix the pseudo random number sequence and the random output data and output mixed data; a controller, coupled to the first random number generator, the second random number generator, and the third random number generator, and configured to control a timing sequence according to which the first random number generator generates the pseudo random number sequence, control a timing sequence according to which the second random number generator outputs the random output data, turn off a word line of the semiconductor memory to allow the second random number generator to read the random output data from the memory array, and control a timing sequence according to which the third random number generator outputs the mixed data. The mapping factor may comprise the mixed data.

In some embodiments, the controller may comprise a disabling module, coupled to the first random number generator and the second random number generator, and configured to disable the first random number generator or the second random number generator.

In some embodiments, the controller may comprise a setting module, coupled to the third random number generator, and configured to set the output from the third random number generator as plain code. The mapping factor may comprise the plain code.

In some embodiments, the mapping factor may comprise a multi-bit mapping factor, and the mapping factor generating unit may be configured to randomly transmit a plurality of bits of the multi-bit mapping factor to at least one of the output of the row address processing unit, the output of the bank address processing unit, and the output of the column address processing unit.

In some embodiments, the logic processing may be an encryption processing configured to encrypt the memory array in accordance with at least one of the output of the row address processing unit, the output of the bank address processing unit, and the output of the column address processing unit.

In some embodiments, the memory array may be not encrypted during a testing mode.

In another aspect, an embodiment of the present invention provides a semiconductor memory. The semiconductor memory may comprise a memory array; an input data processing unit, configured to transmit input data to the memory array; an output data processing unit, configured to read output data from the memory array; and a mapping factor generating unit, configured to generate a mapping factor. The output of the mapping factor generating unit may be coupled to an output of the input data processing unit and an input of the output data processing unit, and the output of the mapping factor generating unit may be further coupled to the memory array. The memory array may write a first result from logical processing performed on the mapping factor and the input data. And the output data may comprise a second result from reverse logical processing performed on the first result and the mapping factor.

In some embodiments, the mapping factor generating unit may comprises a random number generator, having an output serving as the output of the mapping factor generating unit, and configured to generate a pseudo random number sequence; and a controller, coupled to the random number generator, and configured to control a timing sequence according to which the random number generator generates the pseudo random number sequence. The mapping factor may comprise the pseudo random number sequence.

In some embodiments, the mapping factor generating unit comprises a random number generator having an input coupled to the memory array and an output serving as the output of the mapping factor generating unit, and configured to read initial output data from the memory array after the semiconductor memory is powered up and output the initial output data; and a controller, coupled to the random number generator, and configured to control a timing sequence according to which the random number generator outputs the initial output data. The mapping factor may comprise the initial output data.

In some embodiments, the mapping factor generating unit may comprise a random number generator having an input coupled to the memory array and an output serving as the output of the mapping factor generating unit, and configured to read random output data from the memory array and output the random output data; and a controller, coupled to the random number generator and the memory array, configured to control a timing sequence according to which the random number generator outputs the random output data, and turn off a word line of the semiconductor memory to allow the random number generator to read the random output data from the memory array. The mapping factor may comprise the random output data.

In some embodiments, the mapping factor generating unit may comprises a first random number generator, configured to generate a pseudo random number sequence; a second random number generator having an input coupled to the memory array, and configured to read initial output data from the memory array after the semiconductor memory is powered up and output the initial output data; a third random number generator having an output serving as the output of the mapping factor generating unit, coupled to an output of the first random number generator and an output of the second random number generator, and configured to randomly mix the pseudo random number sequence and the initial output data, and output mixed data; and a controller, coupled to the first random number generator, the second random number generator, and the third random number generator, and configured to control a timing sequence according to which the first random number generator generates the pseudo random number sequence, control a timing sequence according to which the second random number generator generates the initial output data, and control a timing sequence according to which the third random number generator generates the mixed data. The mapping factor may comprise the mixed data.

In some embodiments, the mapping factor generating unit may comprise a first random number generator, configured to generate a pseudo random number sequence; a second random number generator having an input coupled to the memory array, and configured to read random output data from the memory array and output the random output data; a third random number generator having an output serving as the output of the mapping factor generating unit, coupled to an output of the first random number generator and an output of the second random number generator, and configured to randomly mix the pseudo random number sequence and the random output data, and output mixed data; and a controller, coupled to the first random number generator, the second random number generator, and the third random number generator, and configured to control a timing sequence according to which the first random number generator generates the pseudo random number sequence, control a timing sequence according to which the second random number generator outputs the random output data, turn off a word line of the semiconductor memory to allow the second random number generator to read the random output data from the memory array, and control a timing sequence according to which the third random number generator outputs the mixed data. The mapping factor may comprise the mixed data.

In some embodiments, the logic processing may be an encryption processing configured to encrypt the memory array in accordance with at least one of the output of the row address processing unit, the output of the bank address processing unit, and the output of the column address processing unit.

In some embodiments, the memory array may be not encrypted during a testing mode.

The embodiments of the present invention adopt the above technical solutions, and can improve the security of the memory by encrypting the column address, the row address, the bank address or the input/output data, and can further improve the service life and reliability of the memory by using the random mapping factor for encryption.

The above summary is exemplary and explanatory only and is not restrictive of this present invention in any way. In addition to the illustrative aspects, embodiments and features described above, further aspects, embodiments and features of the present invention will be readily apparent by reference to the appended drawings and the following detailed description.

BRIEF DESCRIPTION OF THE DRAWINGS

Unless otherwise specified, the same reference numbers used throughout the drawings refer to the same or similar parts/elements. The drawings are not necessarily drawn to scale. It should be understood that these drawings present only some embodiments of the present invention, and shall not be construed as a limitation to the scope of the present invention.

DETAILED DESCRIPTION OF THE EMBODIMENTS

The principles and spirit of the present invention will now be described below with reference to some exemplary embodiments. It is to be understood that these embodiments are presented only to enable those skilled in the art to better understand and implement the present invention, and shall not be construed to limit the present invention in any way. Rather, these embodiments are presented to provide a full and thorough understanding of the present invention, and to fully convey the concepts of the present invention to those skilled in the art.

In the present invention, the number of any element in the figures is used for the purpose of exemplary illustration rather than a limitation, and any naming is used only for the purpose of distinguishing rather than a limitation.

Embodiment 1

Figure 1:
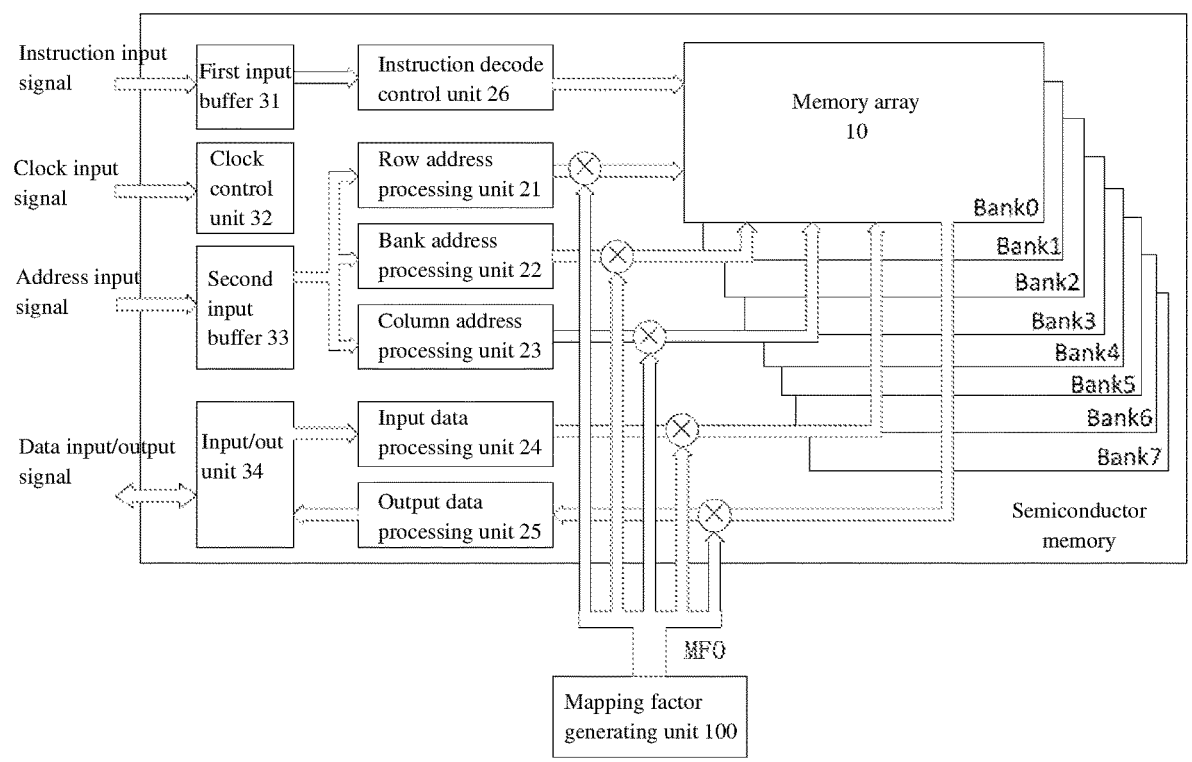
FIG. 1 is a schematic diagram illustrating a circuit of a semiconductor memory in accordance with Embodiment 1 of the present invention.

FIG. 1 is a schematic diagram illustrating a circuit of a semiconductor memory in accordance with this embodiment of the present invention. Referring to FIG. 1, the semiconductor memory in this embodiment may include a memory array 10, a row address processing unit 21, a bank address processing unit 22, a column address processing unit 23, an input data processing unit 24, an output data processing unit 25, and a mapping factor generating unit 100.

The memory array 10 may include a plurality of banks, such as bank[0:7]. Each bank may include a plurality of memory cells arranged in an array. Further, each of the memory cells can have a row address, a column address, and a bank address, such that the semiconductor memory can input (write) data to be stored to the memory cell and output (read) the stored data from the memory cell.

The row address processing unit 21, the bank address processing unit 22, and the column address processing unit 23 may be configured to obtain a row address, a bank address, and a column address (addressing), respectively, based on an address input signal. Further, the semiconductor memory of this embodiment may further include a second input buffer 33 configured to receive and buffer the address input signal, and output the buffered address input signal to the row address processing unit 21, the bank address processing unit 22, and the column address processing unit 23.

The specific configurations of the second input buffer 33, the row address processing unit 21, the bank address processing unit 22, and the column address processing unit 23 may be adopted from various technical solutions known to those skilled in the art, which will not described in detail herein.

The input data processing unit 24 may be configured to transmit input data. Specifically, the input data processing unit 24 may be configured to buffer and perform a serial-to-parallel conversion to the data input thereto and then transmit the data to the memory array 10. The output data processing unit 25 may be configured to transmit output data. Specifically, the output data processing unit 25 may be configured to retrieve data from the memory array 10, and to buffer and perform a parallel-to-serial conversion to the data retrieved, and then output the data. Further, the semiconductor memory of this embodiment may further include an input/output unit 34 configured to receive and transmit data input and output signals.

The specific configurations of the input data processing unit 24, the output data processing unit 25, and the input/output unit 34 may be adopted from various technical solutions known to those skilled in the art, which will not be described in detail herein.

The mapping factor generating unit 100 may be configured to generate and output a mapping factor (MF) MF0.

The output of the mapping factor generating unit 100 may be coupled to one or more of the output of the row address processing unit 21, the output of the bank address processing unit 22, the output of the column address processing unit 23, the output of the input data processing unit 24, and the input of the output data processing unit 25.

The input data of the input data processing unit 24 may correspond to the output data of the output data processing unit 25. Therefore, when the output of the mapping factor generating unit 100 is coupled to the output of the input data processing unit 24, the output of the mapping factor generating unit 100 should also be coupled to the input of the output data processing unit 25, vice versa.

When the output of the mapping factor generating unit 100 is coupled to the output of the row address processing unit 21, the result from logical processing performed on the mapping factor MF0 and the row address may be transmitted to the memory array 10 to select corresponding memory cells.

When the output of the mapping factor generating unit 100 is coupled to the output of the bank address processing unit 22, the result from logical processing performed on the mapping factor MF0 and the bank address may be transmitted to the memory array 10 to select corresponding memory cells.

When the output of the mapping factor generating unit 100 is coupled to the output of the column address processing unit 23, the result from logical processing performed on the mapping factor MF0 and the column address may be transmitted to the memory array 10 to select corresponding memory cells.

When the output of the mapping factor generating unit 100 is coupled to the output of the input data processing unit 24 and the input of the output data processing unit 25, first logical processing may be performed on the mapping factor MF0 and the input data transmitted by the input data processing unit 24 to acquire a first result. The first result may be stored as the final input data into the selected memory cell. When the output data processing unit 25 reads the stored data (i.e., the first result) from the memory array 10, second logical processing may be performed on the first result and the mapping factor MF0 to acquire a second result, and the second result may serve as the output data. The first logic processing and the second logic processing may be mutual reverse processing. The first logic processing and the second logic processing may be the same or different encryption processing, and configured to encrypt the corresponding memory array, or portion thereof, so that the each storage unit of the semiconductor memory, such as a memory array, a bank, portion of the memory array having particular row addresses or column addresses can be independently encrypted using the mapping factor MF0, or portion thereof. Alternatively, the first logic processing may be an encryption processing, and the second logic processing may be a decryption processing that can be used decrypt the data encrypted by the first logic processing.

The semiconductor memory in this embodiment may further include a register configured to store the first logic and the mapping factor MF0. When the read operation is performed, the first logic and the mapping factor MF0 may be called from the register, then the second logical processing which is reverse to the first logic may be performed on the first result and the mapping factor MF0. The register may be arranged in the mapping factor generating unit 100, or may be arranged in other structures of the semiconductor memory, which is not limited in this embodiment.

In this embodiment, the mapping factor MF0 for logical processing with the row address, the mapping factor MF0 for logical processing with the bank address, the mapping factor MF0 for logical processing with the column address, and the mapping factor MF0 for logical processing with the input data may be the same, or may be different.

The mapping factor MF0 output by the mapping factor generating unit 100 may be a multi-bit mapping factor. The mapping factor generating unit 100 may randomly allocate a mapping factor MF0 of a corresponding number of bits to the row address processing unit 21, the bank address processing unit 22, the column address processing unit 23, the input data processing unit 24, or the output data processing unit 25, based on their requirements to data regarding the number of bits.

It should be noted that, the mapping factor MF0 in this embodiment may be derived from a same mapping factor generating unit 100. However, this is not a limitation to the generating form of the mapping factor MF0. For example, the mapping factor MF0 for the row address, the mapping factor MF0 for the bank address, the mapping factor MF0 for the column address, and the mapping factor MF0 for the input data may be derived from different mapping factor generators, respectively, and may be controlled separately by different control units.

Figure 2:
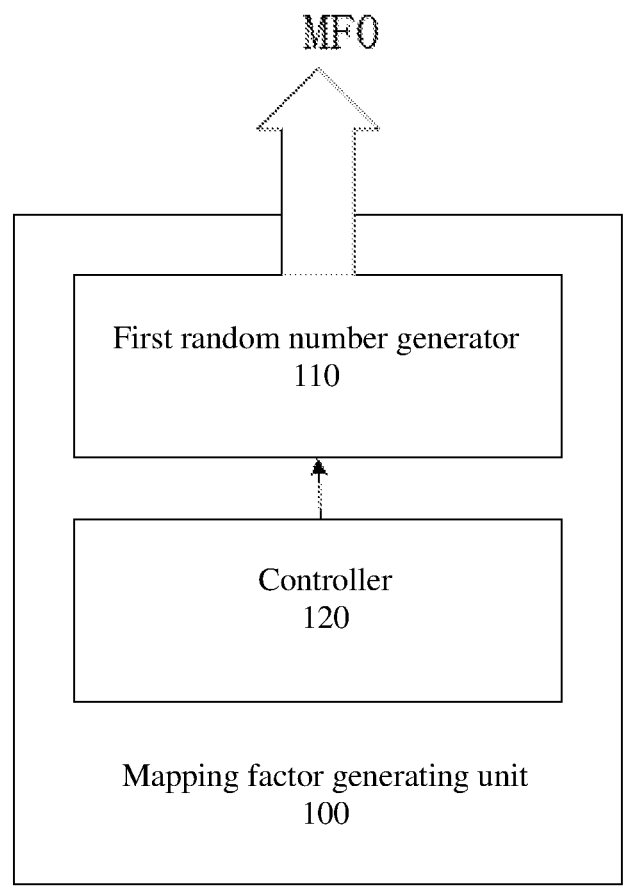
FIG. 2 is a schematic diagram illustrating a circuit of a mapping factor generating unit of a semiconductor memory in accordance with Embodiment 1 of the present invention.

The mapping factor MF0 may be randomly generated. For example, referring to FIG. 2, the mapping factor generating circuit 100 of the present embodiment may include a first random number generator 110 and a controller 120.

The output of the first random number generator 110 may form the output of the mapping factor generating unit 100, that is, the mapping factor MF0 may be generated by the first random number generator 110. The first random number generator 110 may be configured to generate a set of pseudo random number sequences, such that the mapping factor MF0 may be a pseudo random number sequence. The controller 120 may be coupled to the first random number generator 110, and configured to control the timing sequence according to which the first random number generator 110 generates the pseudo random number sequence (i.e., the MF0), to the extent that the timing sequence of the mapping factor MF0 and the timing sequence of the row address (or bank address or column address or input/output data) are consistent.

Other configurations of the semiconductor memory, such as the first input buffer 31, the second input buffer 33, the clock control unit 32, and the instruction decode control unit 26 shown in FIG. 1, may be adopted from various technical solutions known to those skilled in the art, which will not described in detail herein.

Embodiment 2

Figure 3:
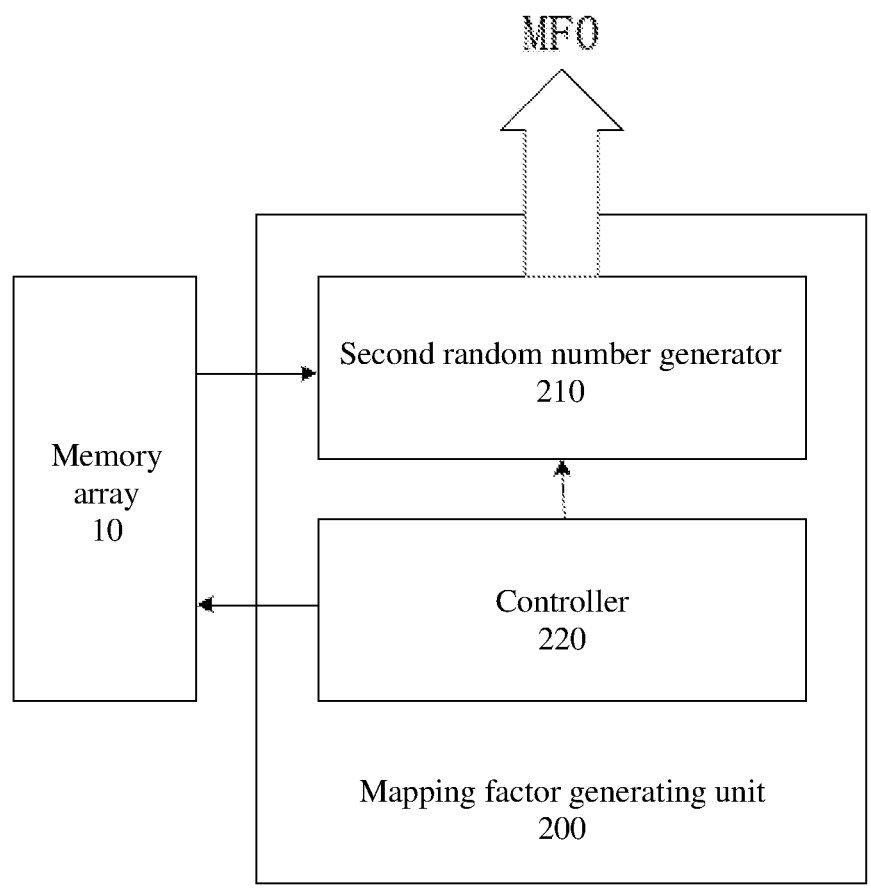
FIG. 3 is a schematic diagram illustrating a circuit of a mapping factor generating unit of a semiconductor memory in accordance with Embodiment 2 of the present invention.

The difference between this embodiment and Embodiment 1 is that the mapping factor MF0 is output by the mapping factor generating unit 200. Referring to FIG. 3, the mapping factor generating unit 200 in this embodiment may include a second random number generator 210 and a controller 220.

The input of the second random number generator 210 may be coupled to the memory array 10, and the output of the second random number generator 210 may serve as the output of the mapping factor generating unit 200, that is, the mapping factor MF0 may be generated by the second random number generator 210. The controller 220 may be coupled to the second random number generator 210.

Example 1: The second random number generator 210 may be configured to read initial output data from the memory array 10 after the semiconductor memory is powered up and output the initial output data, such that the mapping factor MF0 may be the initial output data after the semiconductor memory is powered up. Since no writing operation has been performed on the semiconductor memory, the data stored in the memory array remains random and unknown. Therefore, the initial output data read may also be unknown, and the mapping factor MF0 may be ensured to be random. The controller 220 may be configured to control the timing sequence according to which the second random number generator 210 generates the initial output data (i.e., the MF0), to the extent that the timing sequence of the mapping factor MF0 and the timing sequence of the row address (or bank address or column address or input/output data) are consistent. The controller 220 may also be coupled to the memory array 10 to control the read operation on the memory array 10 after the semiconductor memory is powered up.

Example 2: The second random number generator 210 may be configured to read random output data from the memory array 10 and output the random output data, such that the mapping factor MF0 may be the random output data of the semiconductor memory. The controller 220 may be configured to control the timing sequence according to which the second random number generator 210 generates the random output data (i.e., the MF0), such that the timing sequence of the mapping factor MF0 and the timing sequence of the row address (or bank address or column address or input/output data) are consistent. The controller 220 may also be coupled to the memory array 10, and configured to turn off the word line of the semiconductor memory to allow the sense amplifier of the semiconductor memory to randomly amplify data. And the amplified data may serve as the random output data.

It should be noted that the above two examples may be used in combination for generating the mapping factor MF0. For example, the data obtained by randomly mixing the mapping factor generated in example 1 and the mapping factor generated in example 2 may serve as the mapping factor MF0.

Embodiment 3

Figure 4:
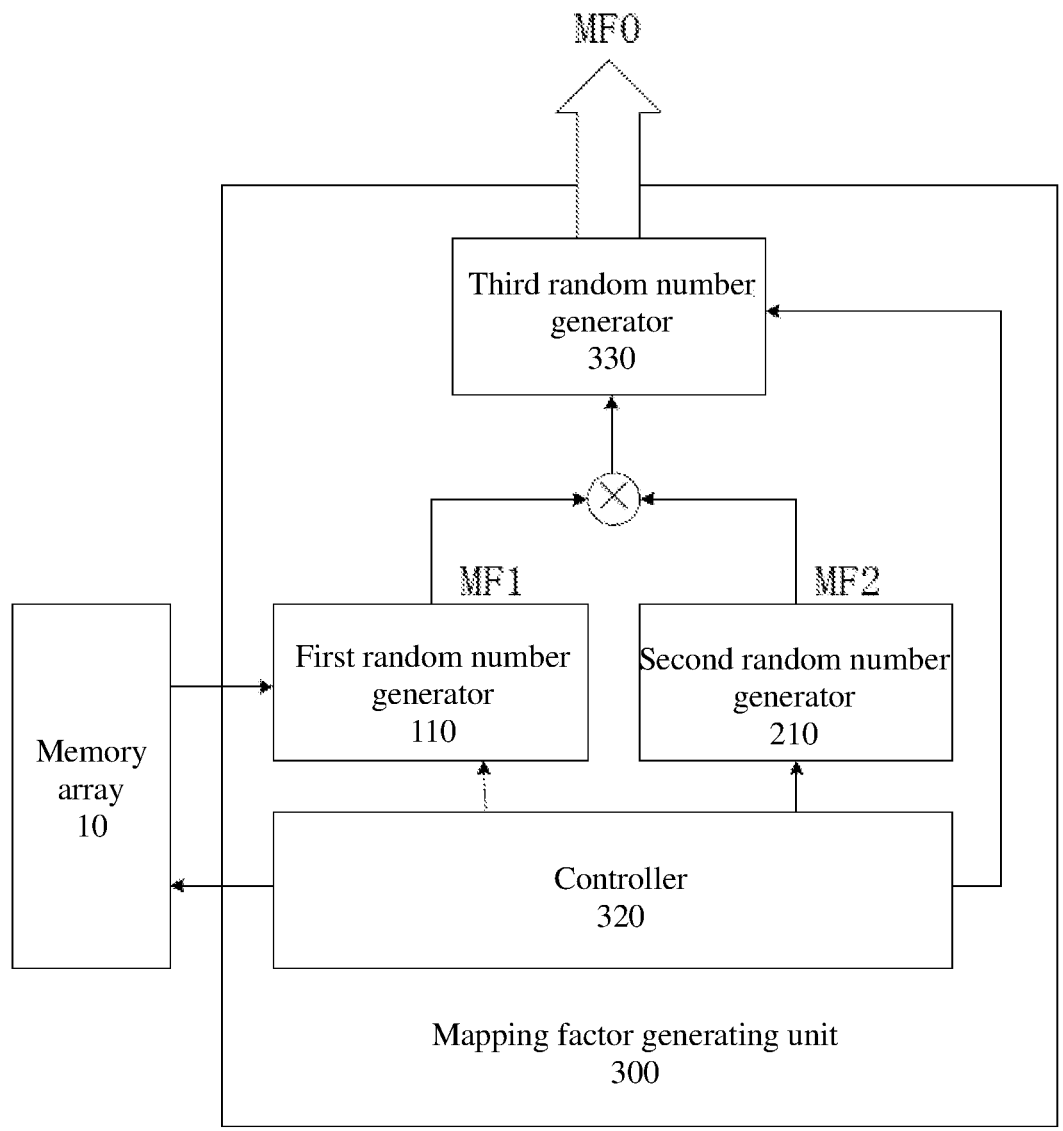
FIG. 4 is a schematic diagram illustrating a circuit of a mapping factor generating unit of a semiconductor memory in accordance with Embodiment 3 of the present invention.

The difference between this embodiment and Embodiment 1 and Embodiment 2 is that the mapping factor MF0 is output by the mapping factor generating unit 300. Referring to FIG. 4, the mapping factor generating unit 300 in this embodiment may include a first random number generator 110, a second random number generator 210, a third random number generator 330, and a controller 320.

The pseudo random number sequence output by the first random number generator 110 may serve as the mapping factor MF1, the initial output data or the random output data output by the second random number generator 210 may serve as the mapping factor MF2. An input of the third random number generator 330 may be coupled to the output of the first random number generator 110 and the output of the second random number generator 210, and may be configured to randomly mix the pseudo random number sequence and the random output data (or initial output data), and output the mixed data. The output of the third random number generator 330 may serve as the output of the mapping factor generating unit 300, such that the mapping factor MF0 may be the mixed data.

The third random number generator 330 may be a latch for latching and outputting the mixed data.

The controller 320 may be coupled to the first random number generator 110, the second random number generator 210, the third random number generator 330, and the memory array 10. In addition to having the functions of the controller 120 and the controller 220, the controller 320 may also be configured to control the timing sequence according to which the third random number generator 330 outputs the mixed data.

Figure 5:
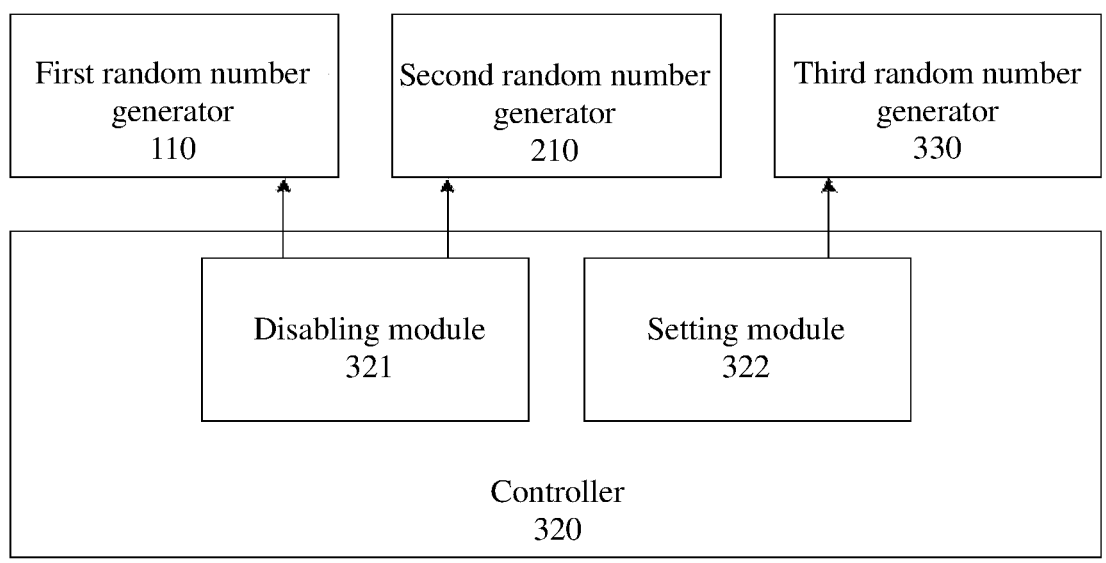
FIG. 5 is a schematic diagram illustrating a circuit of a controller of a semiconductor memory in accordance with Embodiment 3 of the present invention.

Referring to FIG. 5, the controller 320 may include a disabling module 321. The disabling module 321 may be coupled to the first random number generator 110 and the second random number generator 210, and configured to disable the first random number generator 110 or the second random number generator 210 such that either the pseudo random number sequence or the initial output data (or random output data) may be selected to serve as the mapping factor MF0. When the semiconductor memory is under testing, the disabling module 321 may be activated to disable the first random number generator 110, the second random number generator 210, first logic processing, and/or the second logic processing so that the semiconductor memory is not encrypted.

Referring to FIG. 5, the controller 320 may include a setting module 322. The setting module 322 may be coupled to the third random number generator 330, and configured to set the output from the third random number generator 330 as plain code (i.e., the data content of the mapping factor is known), such that the mapping factor MF0 may be plain code. For example, in the test phase of the semiconductor memory, the MF0 may be forced to be set as "0," to the extent that the addresses (including the row address, bank address, and column address) may not be randomly distributed in the semiconductor memory, so as to perform specific tests or defect location to a designated address.

In conclusion, the security of the semiconductor memory according to the embodiments of the present invention can be improved by using the mapping factors to randomly process the column address, the row address, the bank address, or the input/output data. In addition, this random processing can ensure a balanced use of each of the addresses, and reduce the number of accesses to any particular address, thereby prolonging the service life and improving reliability of the semiconductor memory. In other words, the standard deviation of the use of the each of the addresses is small, such as no more than 10% of the average use (mean) of the addresses. Moreover, the degradation rate of the path functionality of the WL decoder circuit can be reduced without increasing the sizes of the timing circuit and the device, thereby reducing the cost of the design and manufacturing processes.

In the description of the present invention, it is to be understood that the terms "first" and "second" are used for descriptive purpose only, and shall not be construed as indicating or implying a relative importance or implicitly indicating the number of technical features indicated. Thus, features defining "first" and "second" may include one or more of the features either explicitly or implicitly. In the description of the present invention, the meaning of "a plurality" is two or more unless specifically defined otherwise.

In the present invention, the terms "installation," "coupled," "connected," "fixed," and the like, shall be understood in a broad sense. For example, it may comprise either a fixed connection or a detachable connection; or a mechanical connection, an electrical connection, or a communication connection; or a direct connection, or an indirect connection through an intermediate medium; or an internal connection of two components or an interaction of two components. The specific meanings of the above terms in the present invention can be understood by those skilled in the art on a case-by-case basis.

In addition, although the spirit and the principles of the present invention have been described with reference to a number of specific embodiments, it is to be understood that the present invention is not limited to the specific embodiments disclosed. The division of the parts of the present invention does not mean that the features included in these parts cannot be combined. Such division is only for the convenience of expression. The present invention is intended to cover various modifications and equivalent arrangements without departing from the spirit and the principles of the present invention.

The invention claimed is:

1. A semiconductor memory, comprising:
   a memory array;
   a row address processing unit, configured to output a row address;
   a bank address processing unit, configured to output a bank address;
   a column address processing unit, configured to output a column address; and
   a mapping factor generating unit, configured to generate a mapping factor, wherein an output of the mapping factor generating unit is coupled to at least one of an output of the row address processing unit, an output of the bank address processing unit, and an output of the column address processing unit, and the output of the mapping factor generating unit is further coupled to the memory array,
   wherein the memory array receives a result from logical processing performed on the mapping factor and at least one of the row address, the bank address, and the column address, and
   wherein the mapping factor generating unit is configured so that a standard deviation of a usage rate of the at least one of the row address, the bank address and the column address is no more than 10% of an average usage rate of the at least one of the row address, the bank address and the column address.

2. The semiconductor memory of claim 1, wherein the mapping factor generating unit comprises:
   a random number generator having an output serving as the output of the mapping factor generating unit, and configured to generate a pseudo random number sequence, wherein the mapping factor comprises the pseudo random number sequence; and
   a controller, coupled to the random number generator, and configured to control a timing sequence according to which the random number generator generates the pseudo random number sequence.

3. The semiconductor memory of claim 1, wherein the mapping factor generating unit comprises:
   a random number generator having an input coupled to the memory array and an output serving as the output of the mapping factor generating unit, and configured to read initial output data from the memory array after the semiconductor memory is powered up and output the initial output data, wherein the mapping factor comprises the initial output data; and
   a controller, coupled to the random number generator, and configured to control a timing sequence according to which the random number generator outputs the initial output data.

4. The semiconductor memory of claim 1, wherein the mapping factor generating unit comprises:
   a random number generator having an input coupled to the memory array and an output serving as the output of the mapping factor generating unit, and configured to read random output data from the memory array and output the random output data wherein the mapping factor comprises the random output data; and
   a controller, coupled to the random number generator and the memory array, and configured to control a timing sequence according to which the random number generator outputs the random output data, and configured to turn off a word line of the semiconductor memory to allow the random number generator to read the random output data from the memory array.

5. The semiconductor memory of claim 1, wherein the mapping factor generating unit comprises:
   a first random number generator, configured to generate a pseudo random number sequence;
   a second random number generator having an input coupled to the memory array, and configured to read initial output data from the memory array after the semiconductor memory is powered up and output the initial output data;
   a third random number generator having an output serving as the output of the mapping factor generating unit, coupled to an output of the first random number generator and an output of the second random number generator, and configured to randomly mix the pseudo random number sequence and the initial output data and output mixed data wherein the mapping factor comprises the mixed data; and
   a controller, coupled to the first random number generator, the second random number generator, and the third random number generator, and configured to control a timing sequence according to which the first random number generator generates the pseudo random number sequence, control a timing sequence according to which the second random number generator outputs the initial output data, and control a timing sequence according to which the third random number generator outputs the mixed data.

6. The semiconductor memory of claim 5, wherein the controller comprises a disabling module, coupled to the first random number generator and the second random number generator, and configured to disable the first random number generator or the second random number generator.

7. The semiconductor memory of claim 5, wherein the controller comprises a setting module, coupled to the third random number generator, and configured to set an output from the third random number generator as plain code, wherein the mapping factor comprises the plain code.

8. The semiconductor memory of claim 1, wherein the mapping factor generating unit comprises:
   a first random number generator, configured to generate a pseudo random number sequence;
   a second random number generator having an input coupled to the memory array, and configured to read random output data from the memory array and output the random output data;
   a third random number generator having an output serving as the output of the mapping factor generating unit, coupled to an output of the first random number generator and an output of the second random number generator, and configured to randomly mix the pseudo random number sequence and the random output data and output mixed data wherein the mapping factor comprises the mixed data; and
   a controller, coupled to the first random number generator, the second random number generator, and the third random number generator, and configured to control a timing sequence according to which the first random number generator generates the pseudo random number sequence, control a timing sequence according to which the second random number generator outputs the random output data, turn off a word line of the semiconductor memory to allow the second random number generator to read the random output data from the memory array, and control a timing sequence according to which the third random number generator outputs the mixed data.

9. The semiconductor memory of claim 8, wherein the memory array is configured to be not encrypted during a testing mode.

10. The semiconductor memory of claim 1, wherein the mapping factor comprises a multi-bit mapping factor, and the mapping factor generating unit is configured to randomly transmit a plurality of bits of the multi-bit mapping factor to at least one of the output of the row address processing unit, the output of the bank address processing unit, and the output of the column address processing unit.

11. The semiconductor memory of claim 1, wherein the logic processing is an encryption processing configured to encrypt the memory array in accordance with the at least one of the row address, the bank address, and the column address.

12. A semiconductor memory, comprising:
  a memory array;
  an input data processing unit, configured to transmit input data to the memory array;
  an output data processing unit, configured to read output data from the memory array; and
  a mapping factor generating unit, configured to generate a mapping factor,
  wherein an output of the mapping factor generating unit is coupled to an output of the input data processing unit and an input of the output data processing unit, and the output of the mapping factor generating unit is further coupled to the memory array,
  wherein the memory array writes a first result from logical processing performed on the mapping factor and the input data, wherein the output data comprises a second result from reverse logical processing performed on the first result and the mapping factor, and
  wherein the mapping factor generating unit is configured so that a standard deviation of a usage rate of at least one of a row address, a bank address and a column address of the memory array is no more than 10% of an average usage rate of the at least one of the row address, the bank address and the column address of the memory array.

13. The semiconductor memory of claim 12, wherein the mapping factor generating unit comprises:
  a random number generator, having an output serving as the output of the mapping factor generating unit, and configured to generate a pseudo random number sequence wherein the mapping factor comprises the pseudo random number sequence; and
  a controller, coupled to the random number generator, and configured to control a timing sequence according to which the random number generator generates the pseudo random number sequence.

14. The semiconductor memory of claim 12, wherein the mapping factor generating unit comprises:
  a random number generator, having an input coupled to the memory array and an output serving as the output of the mapping factor generating unit, and configured to read initial output data from the memory array after the semiconductor memory is powered up and output the initial output data, wherein the mapping factor comprises the initial output data; and
  a controller, coupled to the random number generator, and configured to control a timing sequence according to which the random number generator outputs the initial output data.

15. The semiconductor memory of claim 12, wherein the mapping factor generating unit comprises:
  a random number generator having an input coupled to the memory array and an output serving as the output of the mapping factor generating unit, and configured to read random output data from the memory array, and output the random output data wherein the mapping factor comprises the random output data; and
  a controller, coupled to the random number generator and the memory array, and configured to control a timing sequence according to which the random number generator outputs the random output data, and turn off a word line of the semiconductor memory to allow the random number generator to read the random output data from the memory array.

16. The semiconductor memory of claim 12, wherein the mapping factor generating unit comprises:
  a first random number generator, configured to generate a pseudo random number sequence;
  a second random number generator having an input coupled to the memory array, and configured to read initial output data from the memory array after the semiconductor memory is powered up and output the initial output data;
  a third random number generator having an output serving as the output of the mapping factor generating unit, coupled to an output of the first random number generator and an output of the second random number generator, and configured to randomly mix the pseudo random number sequence and the initial output data, and output mixed data wherein the mapping factor comprises the mixed data; and
  a controller, coupled to the first random number generator, the second random number generator, and the third random number generator, and configured to control a timing sequence according to which the first random number generator generates the pseudo random number sequence, control a timing sequence according to which the second random number generator generates the initial output data, and control a timing sequence according to which the third random number generator generates the mixed data.

17. The semiconductor memory of claim 12, wherein the mapping factor generating unit comprises:
  a first random number generator, configured to generate a pseudo random number sequence;
  a second random number generator having an input coupled to the memory array, and configured to read random output data from the memory array and output the random output data;
  a third random number generator having an output serving as the output of the mapping factor generating unit, coupled to an output of the first random number generator and an output of the second random number generator, and configured to randomly mix the pseudo random number sequence and the random output data, and output mixed data, wherein the mapping factor comprises the mixed data; and
  a controller, coupled to the first random number generator, the second random number generator, and the third random number generator, and configured to control a timing sequence according to which the first random number generator generates the pseudo random number sequence, control a timing sequence according to which the second random number generator outputs the random output data, turn off a word line of the semiconductor memory to allow the second random number generator to read the random output data from the memory array, and control a timing sequence according to which the third random number generator outputs the mixed data.

18. The semiconductor memory of claim 12, wherein the logic processing is an encryption processing configured to encrypt the memory array in accordance with the at least one of the row address, the bank address, and the column address.

19. The semiconductor memory of claim 18, wherein the memory array is configured to be not encrypted during a testing mode.

* * * * *